US009711530B1

(12) United States Patent
Ikawa et al.

(10) Patent No.: US 9,711,530 B1
(45) Date of Patent: *Jul. 18, 2017

(54) LOCALLY-TRAP-CHARACTERISTIC-ENHANCED CHARGE TRAP LAYER FOR THREE-DIMENSIONAL MEMORY STRUCTURES

(71) Applicant: SANDISK TECHNOLOGIES LLC, Plano, TX (US)

(72) Inventors: Yusuke Ikawa, Yokkaichi (JP); Kiyohiko Sakakibara, Yokkaichi (JP); Eisuke Takii, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/158,954

(22) Filed: May 19, 2016

Related U.S. Application Data

(60) Provisional application No. 62/313,234, filed on Mar. 25, 2016.

(51) Int. Cl.
*H01L 21/00* (2006.01)
*H01L 27/11582* (2017.01)
(Continued)

(52) U.S. Cl.
CPC .... *H01L 27/11582* (2013.01); *H01L 21/0217* (2013.01); *H01L 21/02247* (2013.01);
(Continued)

(58) Field of Classification Search
CPC ......... H01L 27/11582; H01L 27/11573; H01L 21/0217; H01L 21/02247; H01L 21/02593;
(Continued)

(56) References Cited

U.S. PATENT DOCUMENTS 5,084,417 A 1/1992 Joshi et al.
5,563,105 A 10/1996 Dobuzinsky et al.
(Continued)

FOREIGN PATENT DOCUMENTS

JP 2009-289950 A 12/2009
WO WO 02/15277 A2 2/2002
(Continued)

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Nicholas Tobergte
(74) *Attorney, Agent, or Firm* — The Marbury Law Group PLLC

(57) ABSTRACT

Threshold voltage shift due to programming of a neighboring memory element can be reduced or suppressed by forming a compositionally modulated charge storage layer in a three-dimensional memory device. The compositionally modulated charge storage layer can be formed by providing an oxygen-containing dielectric silicon compound layer outside a tunneling dielectric layer, and subsequently nitriding portions of the oxygen-containing dielectric silicon compound layer only at levels of the control gate electrodes. An alternating stack of sacrificial material layers and insulating layers can be employed to form a memory stack structure therethrough. After removal of the sacrificial material layers, a nitridation process can be performed to convert physically exposed portions of the oxygen-containing dielectric silicon compound layer into silicon nitride portions, which are vertically spaced from one another by remaining oxygen-containing dielectric silicon compound (Continued)

portions that have inferior charge trapping property to the silicon nitride portions.

14 Claims, 17 Drawing Sheets

(51) Int. Cl.
  *H01L 29/51* (2006.01)
  *H01L 21/02* (2006.01)
  *H01L 27/11573* (2017.01)

(52) U.S. Cl.
  CPC .. *H01L 21/02598* (2013.01); *H01L 27/11573* (2013.01); *H01L 29/511* (2013.01); *H01L 29/518* (2013.01); *H01L 21/02252* (2013.01); *H01L 21/02255* (2013.01)

(58) Field of Classification Search
  CPC ......... H01L 21/02252; H01L 21/02255; H01L 29/511; H01L 29/518
  See application file for complete search history.

(56) References Cited

U.S. PATENT DOCUMENTS

| | | | |
|---|---|---|---|
| 5,807,788 | A | 9/1998 | Brodsky et al. |
| 5,915,167 | A | 6/1999 | Leedy |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,691,442 | B2 | 4/2010 | Gandikota et al. |
| 7,745,265 | B2 | 6/2010 | Mokhlesi et al. |
| 7,745,312 | B2 | 6/2010 | Herner et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,283,228 | B2 | 10/2012 | Alsmeier |
| 8,349,681 | B2 | 1/2013 | Alsmeier et al. |
| 8,658,499 | B2 | 2/2014 | Makala et al. |
| 8,877,590 | B1 | 11/2014 | Lee |
| 9,252,151 | B2 | 2/2016 | Chien et al. |
| 9,412,790 | B1* | 8/2016 | Clark ................. H01L 27/2481 |
| 9,443,861 | B1* | 9/2016 | Pachamuthu ..... H01L 27/11524 |
| 2007/0210338 | A1 | 9/2007 | Orlowski |
| 2007/0252201 | A1 | 11/2007 | Kito et al. |
| 2009/0230458 | A1 | 9/2009 | Ishiduki et al. |
| 2009/0283819 | A1 | 11/2009 | Ishikawa et al. |
| 2010/0044778 | A1 | 2/2010 | Seol |
| 2010/0059811 | A1 | 3/2010 | Sekine et al. |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0163968 | A1 | 7/2010 | Kim et al. |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0018047 | A1 | 1/2011 | Komiya |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2011/0298013 | A1 | 12/2011 | Hwang et al. |
| 2012/0001247 | A1 | 1/2012 | Alsmeier |
| 2012/0001249 | A1 | 1/2012 | Alsmeier |
| 2012/0083077 | A1 | 4/2012 | Yang et al. |
| 2012/0142180 | A1 | 6/2012 | Matsushita et al. |
| 2012/0256247 | A1 | 10/2012 | Alsmeier |
| 2013/0161726 | A1 | 6/2013 | Kim et al. |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0008714 | A1 | 1/2014 | Makala et al. |
| 2014/0080309 | A1 | 3/2014 | Park et al. |
| 2014/0175530 | A1 | 6/2014 | Chien et al. |
| 2014/0191312 | A1 | 7/2014 | Kim et al. |
| 2014/0220750 | A1 | 8/2014 | Sohn et al. |
| 2014/0225181 | A1 | 8/2014 | Makala et al. |
| 2014/0332873 | A1 | 11/2014 | Yoo |
| 2015/0340274 | A1 | 11/2015 | Ryan et al. |
| 2016/0086972 | A1 | 3/2016 | Zhang et al. |

FOREIGN PATENT DOCUMENTS

| | | |
|---|---|---|
| WO | WO2009084206 A1 | 7/2009 |
| WO | WO 2012/052298 A1 | 4/2012 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibo.co.jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

Kim, Y.S. et al., "Direct Copper Electroless Deposition on a Tungsten Barrier Layer for Ultralarge Scale Integration," J. Electrochem. Soc., vol. 152, Issue 2, pp. C89-C95, (2005).

Au, Y. et al., "Filling Narrow Trenches by Iodine-Catalyzed CVD of Copper and Manganese on Managanese Nitride Barrier/Adhesion Layers," J. Electrochem. Soc., vol. 158, Issue 5, pp. D248-D253, (2011).

Williams, K.R. et al., "Etch Rates for Micromachining Processing," J. Microelectromechanical Systems, vol. 5, No. 4, pp. 256-269, (1996).

Williams, K.R. et al., "Etch Rates for Micromachining Processing," Part II, J. Microelectromechanical Systems, vol. 12, No. 6, pp. 761-778, (2003).

Claes, M. et al., "Selective Wet Etching of Hf-Based Layers," Abs. 549, 204$^{th}$ Meeting, The Electrochemical Society, Inc., 1 page, (2003).

(56) References Cited

OTHER PUBLICATIONS

Non Final Office Action for Corresponding U.S. Appl. No. 14/468,650, filed Aug. 26, 2014, 19 pages, dated Feb. 5, 2016.
Invitation to Pay Additional Fees and Partial International Search Report for PCT/US2015/046035, dated Jan. 22, 2016, 9 pages.
Kang, D. et al., "Improving the Cell Characteristics Using Low-k Gate Spacer in 1Gb NAND Flash Memory," Electron Devices Meeting, IEDM '06 International, IEEE, pp. 1-4, (2006).
International Search Report and Written Opinion for PCT/US2015/046035, dated Mar. 17, 2016, 20 pages.
International Search Report and written Opinion received in connection with international application No. PCT/US2014/045347; mailed Oct. 2, 2014.
U.S. Appl. No. 13/762,988, filed Feb. 8, 2013, SanDisk Technologies Inc.
U.S. Appl. No. 14/133,979, filed Dec. 19, 2013, SanDisk Technologies Inc.
U.S. Appl. No. 14/183,152, filed Feb. 18, 2014, SanDisk Technologies Inc.
U.S. Appl. No. 14/219,161, filed Mar. 19, 2014, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/264,262, filed Apr. 29, 2014, SanDisk Technologies Inc.
U.S. Appl. No. 14/264,312, filed Apr. 29, 2014, SanDisk Technologies Inc.
U.S. Appl. No. 14/264,407, filed Apr. 29, 2014, SanDisk Technologies Inc.
U.S. Appl. No. 14/282,567, filed May 20, 2014, SanDisk Technologies Inc.
U.S. Appl. No. 14/319,283, filed Jun. 30, 2004, SanDisk Technologies Inc.
U.S. Appl. No. 14/468,650, filed Aug. 26, 2014, SanDisk Technologies Inc.
U.S. Appl. No. 15/012,082, filed Feb. 1, 2016, SanDisk Technologies Inc.
U.S. Appl. No. 15/049,444, filed Feb. 22, 2016, SanDisk Technologies Inc.
Invitation to Pay Additional Fees and Where Applicable, Protest Fee from the International Searching Authority for International Patent Application No. PCT/US2017/018211, mailed May 4, 2017, 15 pages.
USPTO Office Communication for a Corresponding U.S. Appl. No. 15/250,185, mailed May 16, 2017, 19 pages.

* cited by examiner

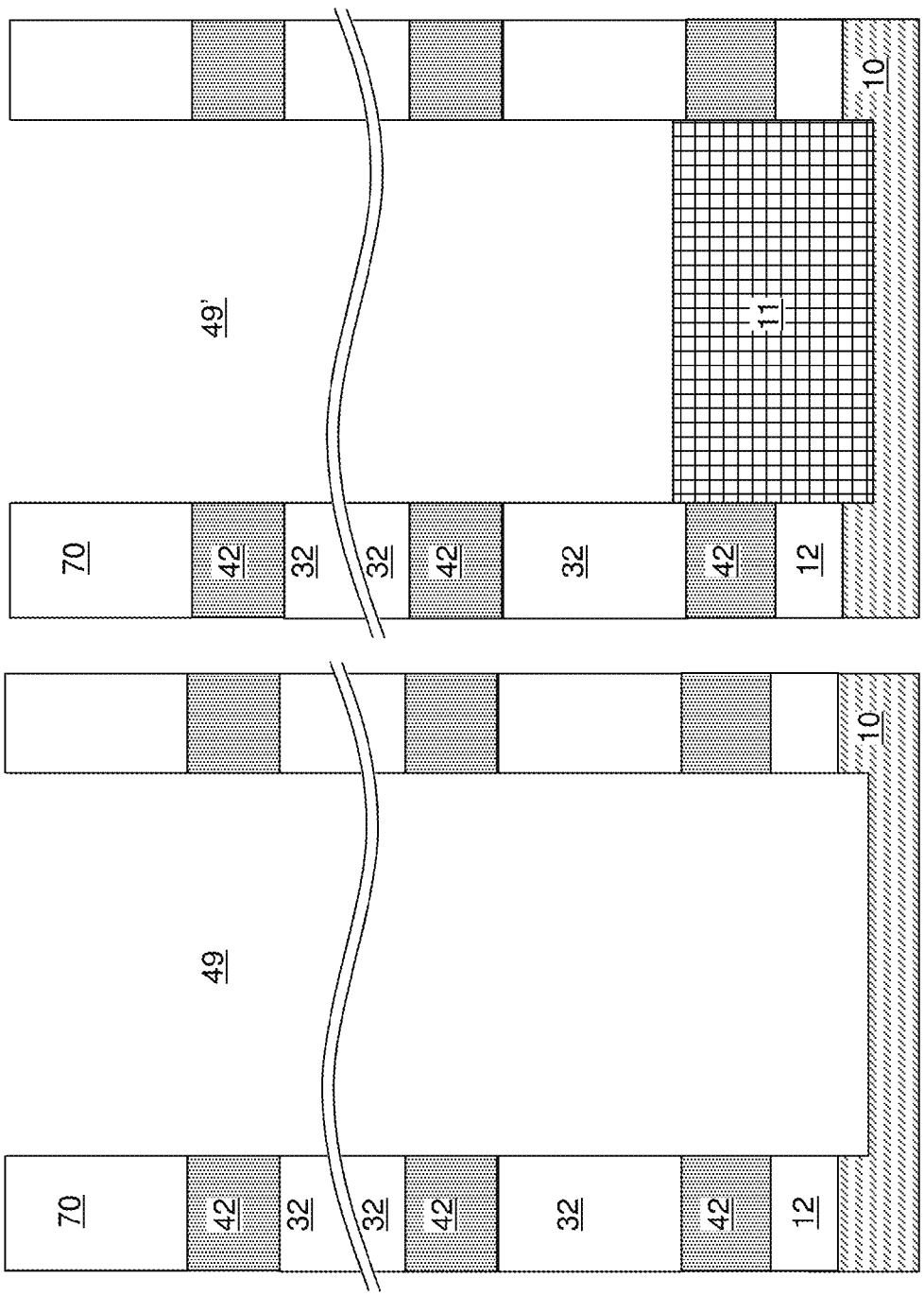

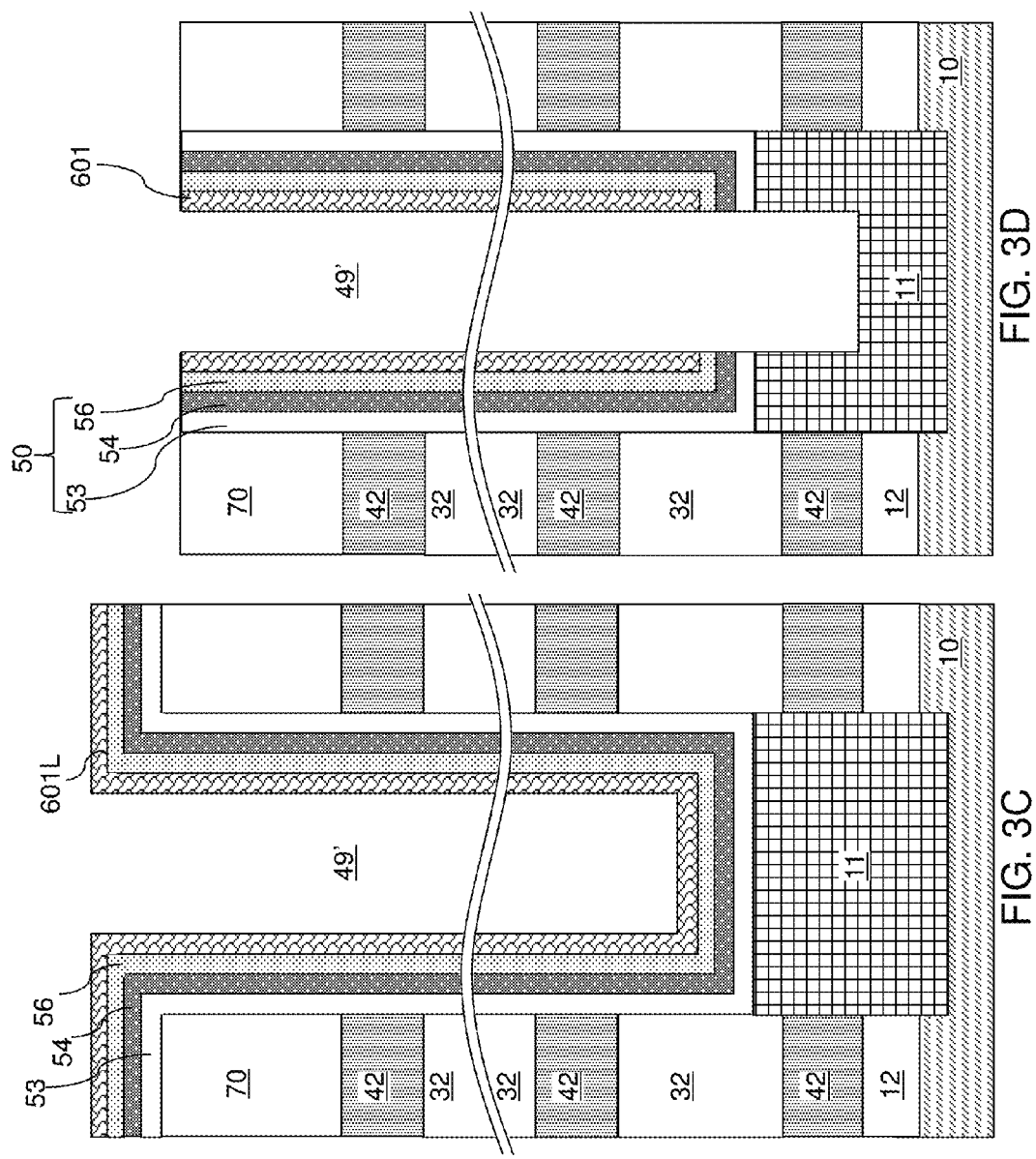

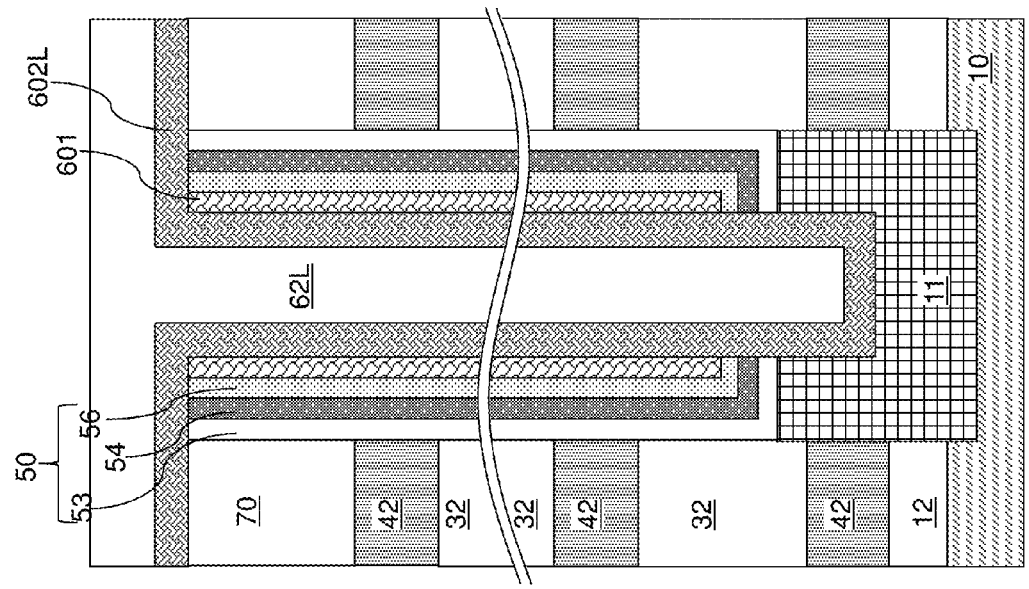
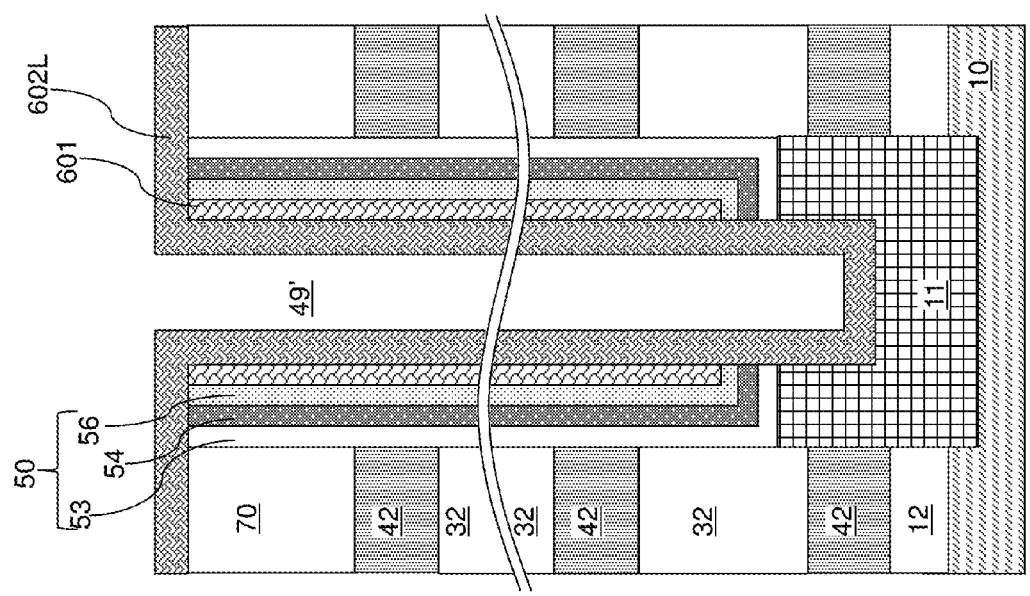
FIG. 3F
FIG. 3E

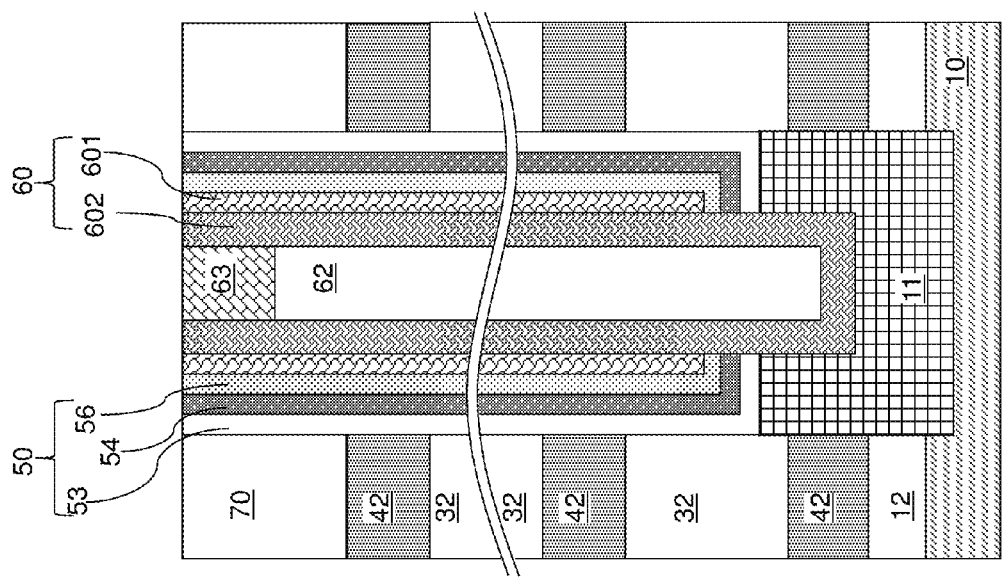
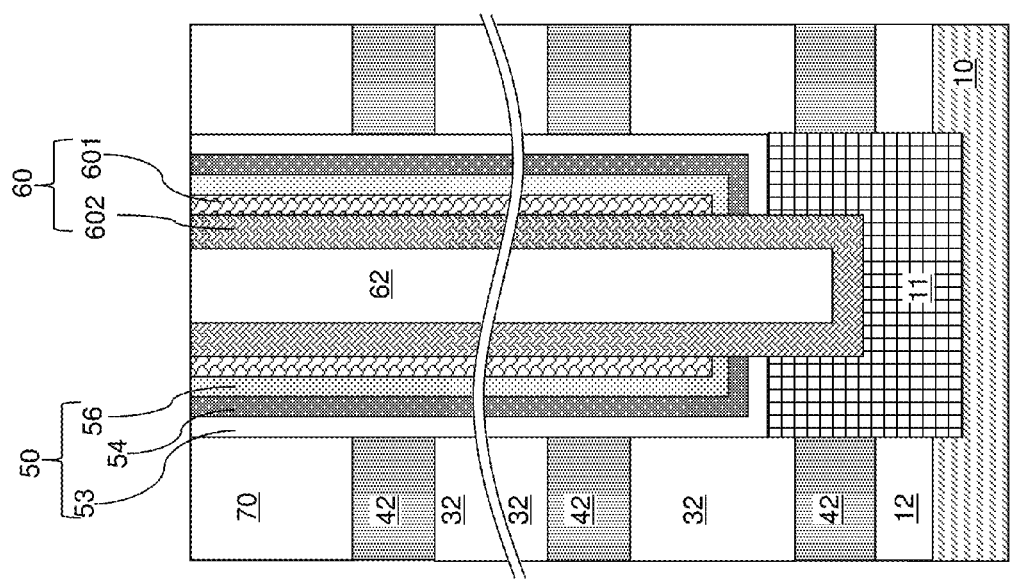

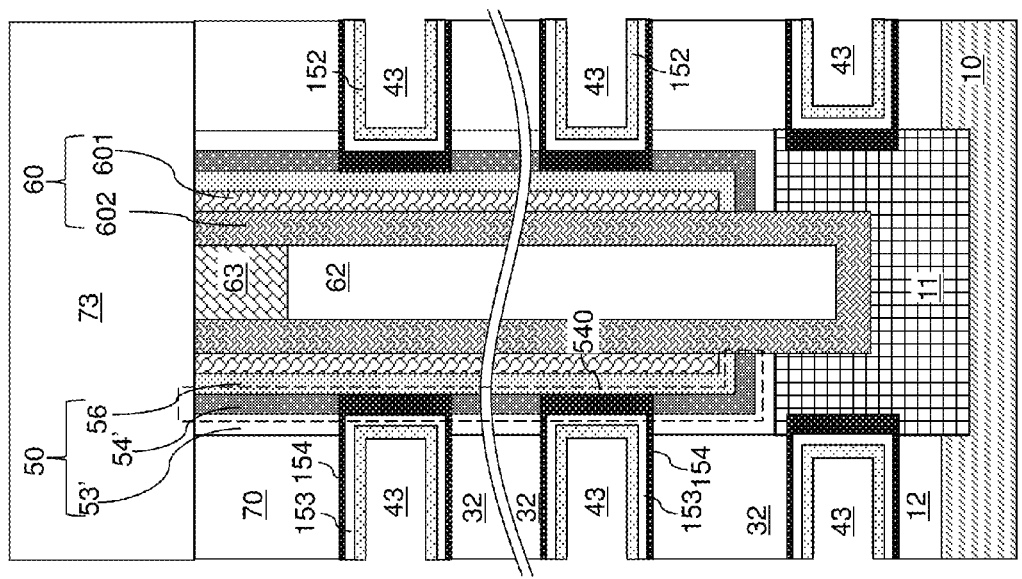
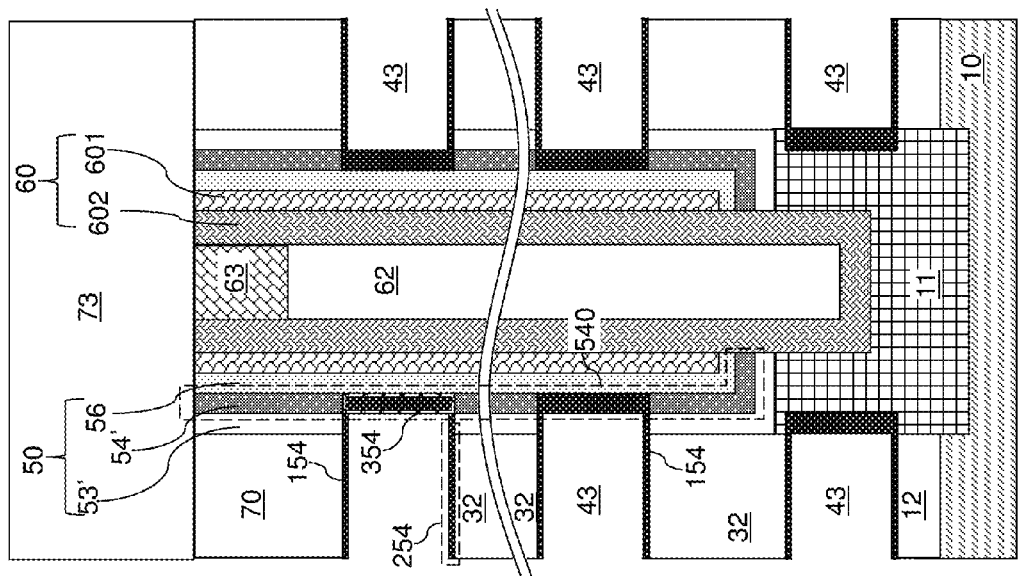

LOCALLY-TRAP-CHARACTERISTIC-ENHANCED CHARGE TRAP LAYER FOR THREE-DIMENSIONAL MEMORY STRUCTURES

FIELD

The present disclosure relates generally to the field of three-dimensional memory devices and specifically to three-dimensional memory devices such as vertical NAND strings and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises an alternating stack of insulating layers and electrically conductive layers located over a substrate; and a memory stack structure extending through the alternating stack and comprising a compositionally modulated charge storage layer, a tunneling dielectric, and a vertical semiconductor channel, wherein the compositionally modulated charge storage layer comprises a vertically alternating stack of silicon nitride portions and silicon oxynitride portions.

According to another aspect of the present disclosure, a method of forming a device structure is provided. An alternating stack of insulating layers and spacer material layers is formed over a substrate. An in-process memory stack structure extending through the alternating stack is formed. The in-process memory stack structure comprises an oxygen-containing dielectric silicon compound layer, a tunneling dielectric, and a vertical semiconductor channel. Portions of the oxygen-containing dielectric silicon compound layer at levels of the spacer material layers are converted into silicon nitride portions that are charge storage elements of a memory device.

BRIEF DESCRIPTION OF THE DRAWINGS

FIGS. 3A-3H are sequential vertical cross-sectional views of a memory opening within the exemplary structure during various processing steps employed to form an in-process memory stack structure according to an embodiment of the present disclosure.

FIGS. 7A-7E are sequential vertical cross-sectional views of a memory opening within the exemplary structure during various processing steps employed to form a compositionally modulated charge storage layer, backside blocking dielectric layers, and electrically conductive layers according to an embodiment of the present disclosure.

DETAILED DESCRIPTION

Figure 1:
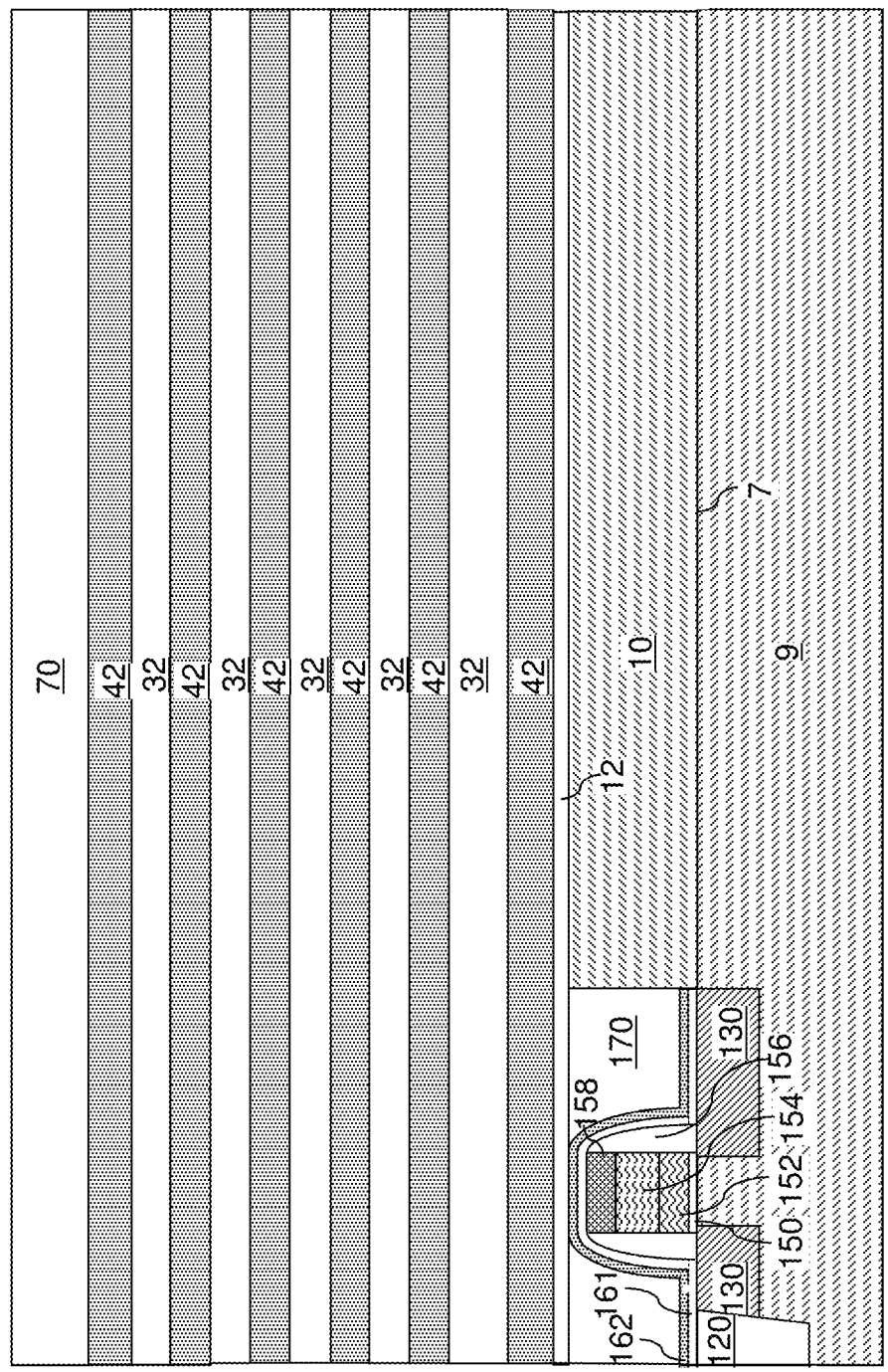
FIG. 1 is a vertical cross-sectional view of an exemplary structure after formation of a stack including an alternating plurality of insulating layers and spacer material layers according to an embodiment of the present disclosure.

As discussed above, the present disclosure is directed to three-dimensional memory devices and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 which can be a layer located on an underlying substrate or which can be the underlying substrate, such as a single crystal silicon wafer. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface. An optional semiconductor material layer 10 can located on the major surface 7 of the substrate semiconductor layer 9.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above, such as single crystal silicon. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed. In one embodiment, the dielectric pad layer 12 can include a gate dielectric material that can be employed as a gate dielectric for a source select gate electrode to be subsequently formed.

A stack of an alternating plurality of first material layers (which can be insulating layers 32) and second material layers (which can be sacrificial material layers 42) is formed over the top surface of the substrate, which can be, for example, on the top surface of the dielectric pad layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality of layers is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 2:
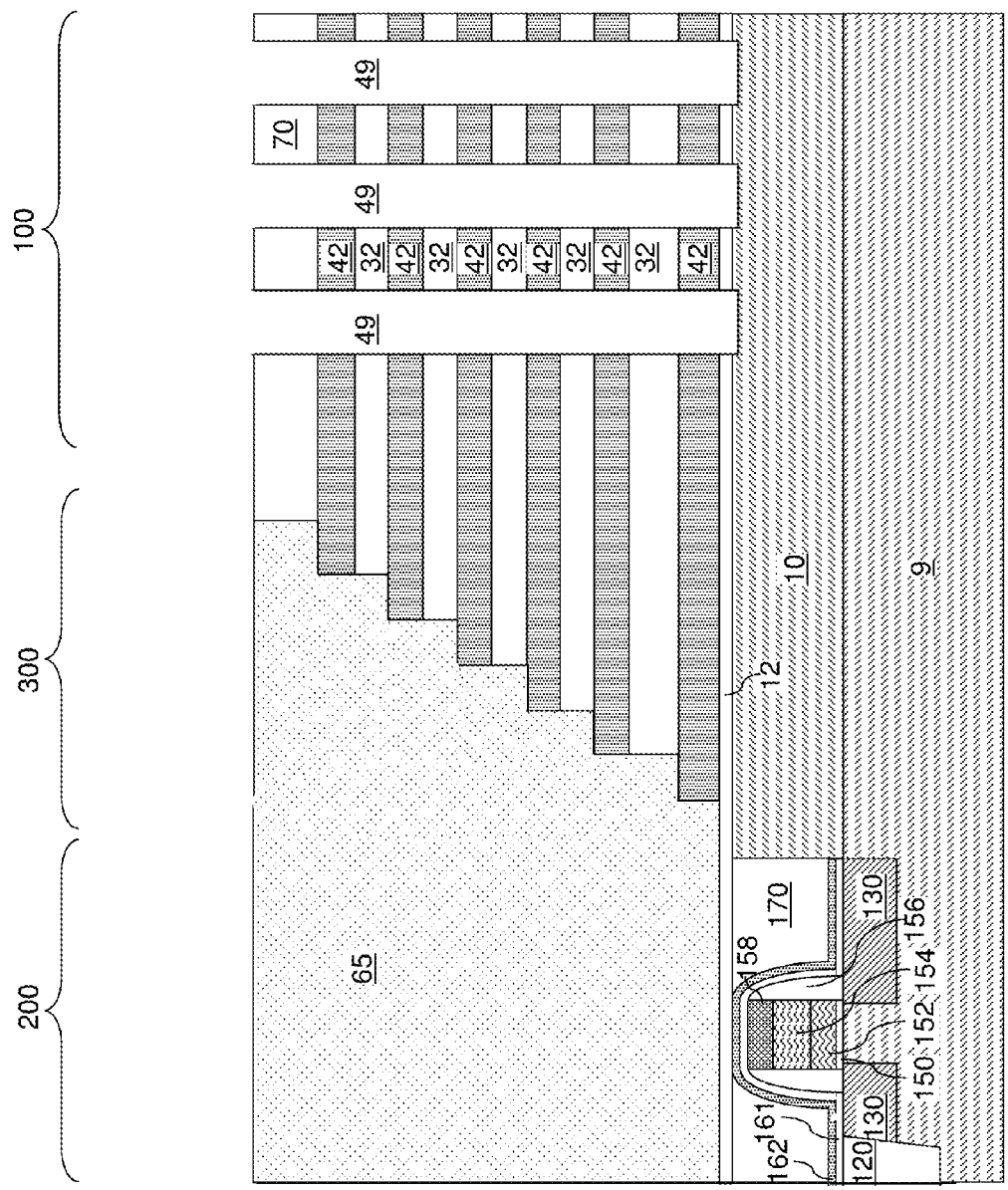
FIG. 2 is a vertical cross-sectional view of the exemplary structure after formation of a retro-stepped dielectric material portion and memory openings extending through the stack according to an embodiment of the present disclosure.

Referring to FIG. 2, a stepped cavity can be formed within the contact region 300 which is located between the device region 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Subsequently, a lithographic material stack (not shown) including at least a photoresist layer can be formed over the insulating cap layer 70 and the retro-stepped dielectric material portion 65, and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

The memory openings 49 are formed through the dielectric pad layer 12 so that the memory openings 49 extend from the top surface of the alternating stack (32, 42) to at least the top surface of the semiconductor material layer 10. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the substrate semiconductor layer 9.

Referring to FIG. 3A, a memory opening 49 in the exemplary device structure of FIG. 2 is illustrated. The memory opening 49 extends through the insulating cap layer 70, the alternating stack (32, 42), the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 3B, an optional epitaxial pedestal 11 can be formed at the bottom portion of each memory opening 49, for example, by selective epitaxy. Each epitaxial pedestal 11 comprises a single crystalline semiconductor material in epitaxial alignment with the single crystalline semiconductor material of the semiconductor material layer 10. In one embodiment, the epitaxial pedestal 11 can be doped with electrical dopants of the same conductivity type as the semiconductor material layer 10. In one embodiment, the top surface of each epitaxial pedestal 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial pedestals 11 with a respective conductive material layer. The epitaxial pedestal 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial pedestal 11. In one embodiment, the epitaxial pedestal 11 can comprise single crystalline silicon. In one embodiment, the epitaxial pedestal 11 can have a doping of the first conductivity type, which is the same as the conductivity type of the semiconductor material layer 10 that the epitaxial pedestal contacts. If a semiconductor material layer 10 is not present, the epitaxial pedestal 11 can be formed directly on the substrate semiconductor layer 9, which can have a doping of the first conductivity type.

Referring to FIG. 3C, a stack of layers including an etch stop layer 53, an oxygen-containing dielectric silicon compound layer 54, a tunneling dielectric layer 56, and an optional first semiconductor channel layer 601L can be sequentially deposited in the memory openings 49.

The etch stop layer 53 preferably comprises a different material than that of the sacrificial material layers 42 and the same material as that the insulating layers 32. For example, the etch stop layer 53 may comprise a silicon oxide layer 53 which includes stoichiometric $SiO_2$ or non-stoichiometric silicon oxide The silicon oxide layer 53 can be deposited employing a conformal deposition process such as chemical vapor deposition or atomic layer deposition. The thickness of the silicon oxide layer 53 can be in a range from 1 nm to 4 nm, such as from 1.5 nm to 3 nm, although lesser and greater thicknesses can also be employed.

The oxygen-containing dielectric silicon compound layer 54 includes a silicon oxynitride material or a silicon oxide material having a greater etch resistance to hydrofluoric acid than the silicon oxide layer 53. In one embodiment, the thickness of the oxygen-containing dielectric silicon compound layer 54 can be in a range from 2 nm to 6 nm. As used herein, silicon oxynitride refers to a material composition of $Si_{(1+/-\delta)}O_{2(1-x)}N_{4x/3}$ in which is in a range from, and including, 0 to 0.1, and x is greater than 0 and less than 1. In one embodiment, x can be in a range from 0.1 to 0.9. In another embodiment, x can be in a range from 0.2 to 0.8. In yet another embodiment, x can be in a range from 0.3 to 0.7. In case the oxygen-containing dielectric silicon compound layer 54 is a silicon oxynitride layer, the silicon oxynitride layer can be formed by deposition of a conformal silicon oxide layer and partial conversion of the silicon oxide material into a silicon oxynitride material by thermal nitridation or thermal oxidation, by deposition of a conformal silicon nitride layer and partial conversion of the silicon nitride material into a silicon oxynitride material by thermal oxidation or thermal nitridation, by deposition of a silicon oxynitride layer from a silicon, oxygen and nitrogen containing precursors, or by deposition of a silicon oxynitride material by alternating deposition of silicon oxide layers and silicon nitride layers and interdiffusion of the silicon oxide layers and silicon nitride layers to form a silicon oxynitride layer having a substantially uniform material composition.

In another embodiment, the silicon oxide layer 53 can be deposited as a doped silicon oxide layer including doped silicate glass (such as borosilicate glass, phosphosilicate glass, or borophosphosilicate glass), and the oxygen-containing dielectric silicon compound layer 54 can be deposited as an undoped silicate glass. Alternatively, the silicon oxide layer 53 can be formed as a low density silicon oxide layer, and the oxygen-containing dielectric silicon compound layer 54 can be formed as a high density silicon oxide layer. Alternatively, the silicon oxide layer 53 and the oxygen-containing dielectric silicon compound layer 54 can be silicon oxide layers formed by different depositions methods such that layers 53 and 54 have different etch characteristics when exposed to the same etching medium. Silicon oxide materials that may be used include, but are not limited to, dichlorosilane (DCS, $H_2SiCl_2$) based silicon oxides, disilane (DS, $Si_2H_6$) based silicon oxides, high aspect ratio process (HARP) non-plasma based CVD using TEOS and ozone sources based silicon oxides, high density plasma (HDP) CVD based silicon oxides, tetraethyl orthosilicate (TEOS) based silicon oxides and borosilicate glass (BSG) or borophosphosilicate glass (BPSG). Selective etching of silicon oxide materials may be performed by chemical dry etching or wet etching techniques. Example silicon oxide combinations suitable for use with selective dry etching techniques are summarized in Table 1 below while combinations suitable for use with wet etching techniques are summarized in Table 2 below. Table 3 below summarizes the process parameters (i.e., reactor type, temperature, pressure, reactant gases and flow ratios) suitable for deposition of the above described silicon oxide materials.

TABLE 1

|  | Etch Selectivity | Etching Method |
|---|---|---|
| DCS Oxide:DS Oxide | 5:1-32:1 (tunable) | CDE (Chemical Dry Etching) |
| HARP:HDP Oxide | 230:1 | CDE (Chemical Dry Etching) |

TABLE 2

| Etch Selectivity (BPSG:TEOS) | Wet etch Method 99.7% Acetic acid:49% HF ratio |
|---|---|
| 27:1 | 200:1 |
| 42:1 | 100:1 |
| 55:1 | 50:1 |

TABLE 3

| Oxide Type | CVD Reactor Type | Temperature | Pressure | Reactant gases & flow ratio |
|---|---|---|---|---|
| DCS Oxide | LPCVD | 700-900° C. | 125 mT-1 T | $DCS:N_2O$ = 0.25-1 |
| DS Oxide | PECVD | ~300° C. | 700 mT | $DS:N_2O$ = 3:1 |
| HARP (TEOS + Ozone) | Non-plasma based CVD | ~400° C. | 760 T (atmospheric) | TEOS and $O_3$ |
| HDP Oxide | PECVD | 300-400° C. | 2-10 T | Ar, $TEOS(SiH_4)$ & $O_2$ |
| TEOS | PECVD | <450° C. | 2-10 T | $TEOS:O_2$ = 1:10-1:20 |
| BPSG | PECVD | 300-500° C. |  | $B_2H_6$, Phosphine & $SiH_4$ |
| BPSG | APCVD | 300-500° C. | 760 T | $B_2H_6$, Phosphine & $SiH_4$ |

In one embodiment, the sacrificial material layers 42 and the insulating layers 32 can have vertically coincident sidewalls, and the oxygen-containing dielectric silicon compound layer 54 can be formed as a single contiguous layer. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down. In another embodiment, the sacrificial material layers 42 can be laterally recessed with respect to the sidewalls of the insulating layers 32 prior to formation of the silicon oxide layer 53, and the oxygen-containing dielectric silicon compound layer 54 can be formed as a single continuous material layer that laterally protrudes outward at each level of the sacrificial material layers 42.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (53, 54, 56, 601L).

Referring to FIG. 3D, the optional first semiconductor channel layer 601L, the tunneling dielectric layer 56L, the oxygen-containing dielectric silicon compound layer 54, the silicon oxide layer 53 are sequentially anisotropically etched employing at least one anisotropic etch process. The portions of the first semiconductor channel layer 601, the tunneling dielectric layer 56, the oxygen-containing dielectric silicon compound layer 54, and the silicon oxide layer 53 located above the top surface of the insulating cap layer 70 can be removed by the at least one anisotropic etch process. Further, the horizontal portions of the first semiconductor channel layer 601L, the tunneling dielectric layer 56, the oxygen-containing dielectric silicon compound layer 54, and the silicon oxide layer 53 at a bottom of each cavity 49' can be removed to form openings in remaining portions thereof. Each of the first semiconductor channel layer 601L, the tunneling dielectric layer 56, the oxygen-containing dielectric silicon compound layer 54, and the silicon oxide layer 53 can be etched by anisotropic etch process.

Each remaining portion of the first semiconductor channel layer 601L constitutes a first semiconductor channel portion 601. The remaining portion of the silicon oxide layer 53 includes a vertical portion contacting outer sidewalls of the oxygen-containing dielectric silicon compound layer 54 and an annular portion contacting an epitaxial channel portion 11 (or a top surface of the semiconductor material layer 10 in case epitaxial channel portions 11 are not formed). The remaining portion of layer 53 comprises a vertical etch stop layer.

A surface of the epitaxial channel portion 11 (or a surface of the semiconductor material layer 10 in case the epitaxial channel portions 11 are not employed) can be physically exposed underneath the opening through the first semiconductor channel portion 601, the tunneling dielectric layer 56, the oxygen-containing dielectric silicon compound layer 54, and the silicon oxide layer 53. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor material layer 10 in case epitaxial channel portions 11 are not employed) by a recess distance. A tunneling dielectric layer 56 is located over the oxygen-containing dielectric silicon compound layer 54. A set of silicon oxide layer 53, an oxygen-containing dielectric silicon compound layer 54, and a tunneling dielectric layer 56 in a memory opening 49 constitutes a memory film 50, which includes a plurality of charge storage regions (as embodied as the oxygen-containing dielectric silicon compound layer 54) that are insulated from surrounding materials by the silicon oxide layer 53 and the tunneling dielectric layer 56. In one embodiment, the first semiconductor channel portion 601, the tunneling dielectric layer 56, the oxygen-containing dielectric silicon compound layer 54, and the silicon oxide layer 53 can have vertically coincident sidewalls.

Referring to 3E, a second semiconductor channel layer 602L can be deposited directly on the semiconductor surface of the epitaxial channel portion 11 or the semiconductor material layer 10 if the epitaxial channel portion 11 is omitted, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 3F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 3G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric layer 56 is surrounded by an oxygen-containing dielectric silicon compound layer 54, and laterally surrounds a portion of the semiconductor channel 60. Each adjoining set of a silicon oxide layer 53, an oxygen-containing dielectric silicon compound layer 54, and a tunneling dielectric layer 56 collectively constitute a memory film 50, which can store electrical charges with a macroscopic retention time. As used herein, a macroscopic retention time refers to a retention time suitable for operation of a memory device as a permanent memory device such as a retention time in excess of 24 hours.

Referring to FIG. 3H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 4:
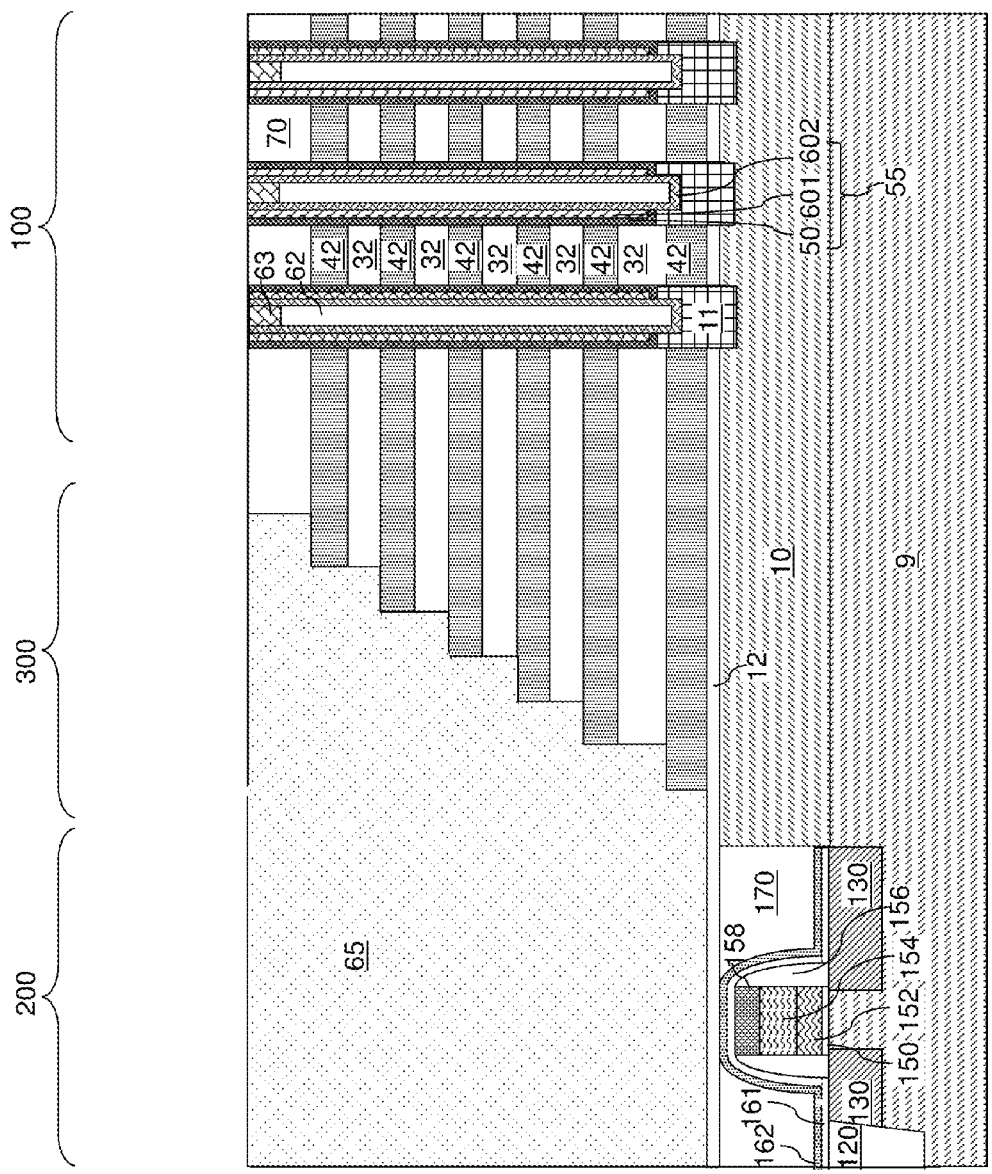
FIG. 4 is a vertical cross-sectional view of the exemplary structure after formation of memory stack structures according to an embodiment of the present disclosure.

Each combination of a memory film 50 and a semiconductor channel 60 in a memory opening 49 constitutes a memory stack structure 55. The memory stack structures 55 are in-process memory stack structures that are subsequently modified. The exemplary memory stack structure 55 can be embedded into the exemplary structure illustrated in FIG. 2. FIG. 4 illustrates the exemplary structure that incorporates multiple instances of the exemplary memory stack structure of FIG. 3H. Each exemplary memory stack structure 55 includes a semiconductor channel 60 (e.g., 601, 602); a tunneling dielectric layer 56 laterally surrounding the semiconductor channel 60 (e.g., 601, 602); an oxygen-containing dielectric silicon compound layer 54; and a silicon oxide layer 53. The exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor material layer 10), and a memory opening extending through the stack (32, 42). The semiconductor device further comprises a silicon oxide layer 53 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. Each memory stack structure 55 can be formed on a top surface of an epitaxial channel portion 11 within a respective memory opening 49.

Figure 5A:
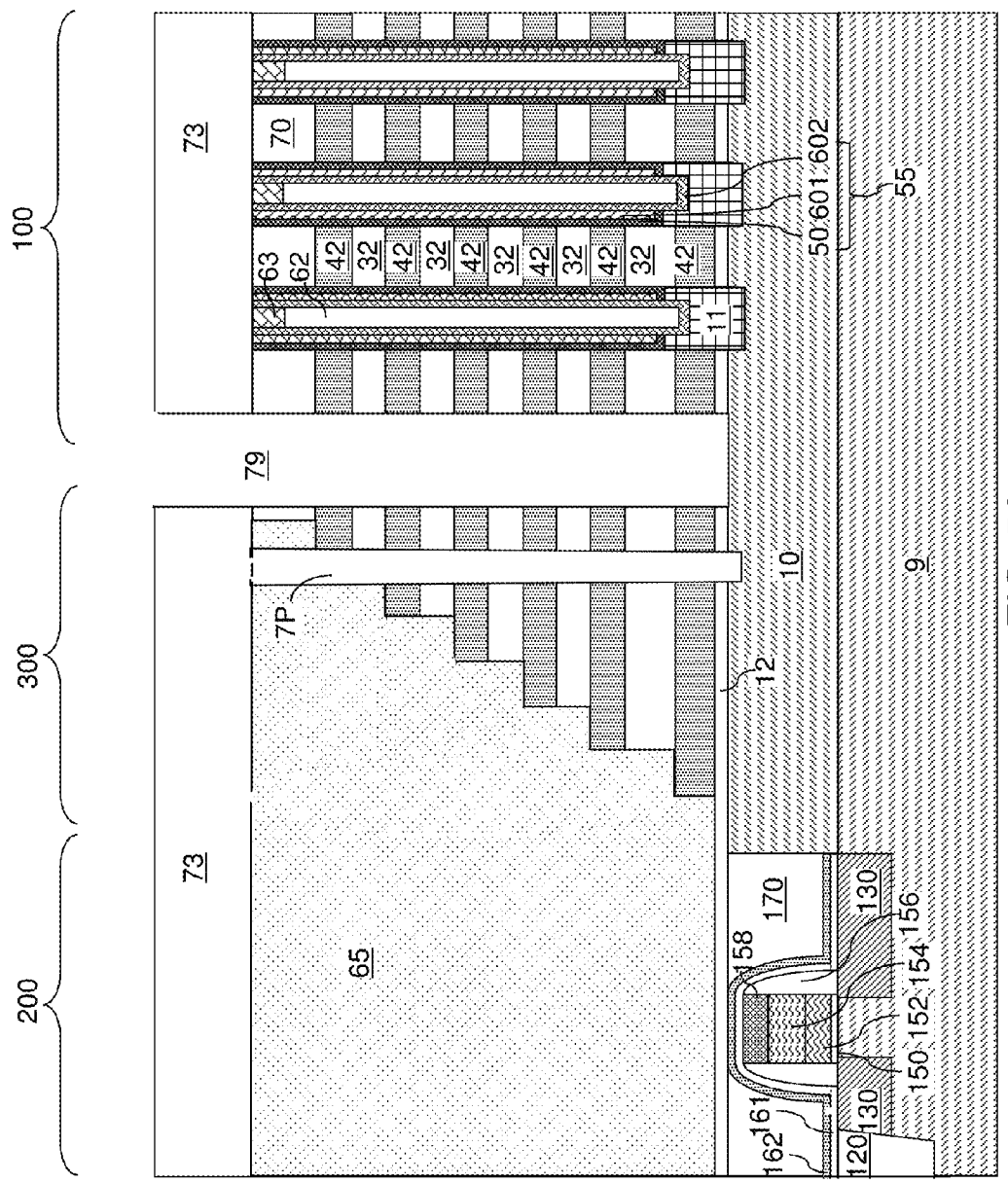
FIG. 5A is a vertical cross-sectional view of the exemplary structure after formation of a backside trench according to an embodiment of the present disclosure.
Figure 5B:
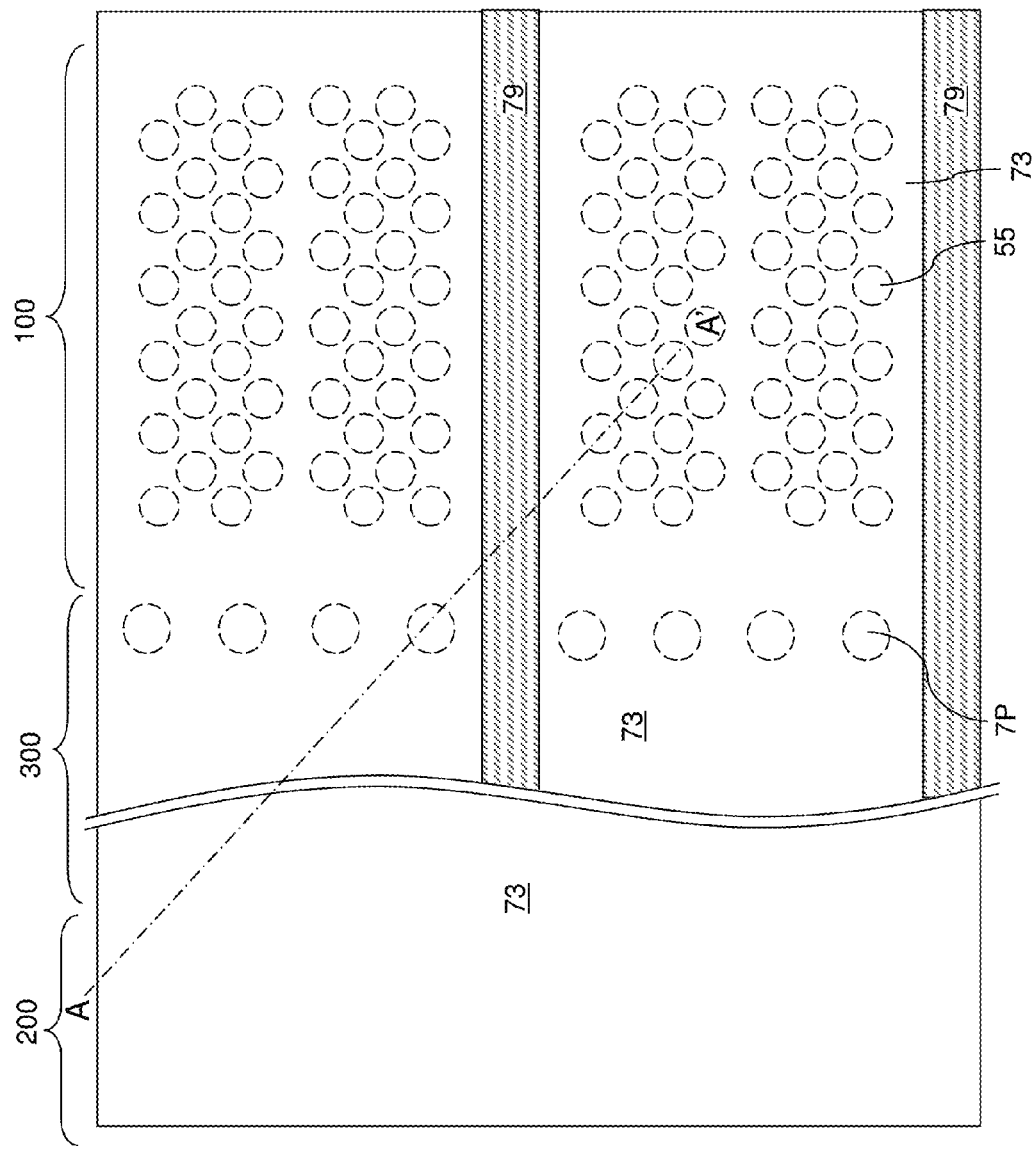
FIG. 5B is a partial see-through top-down view of the exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the insulating cap layer 70 and/or through the alternating stack (32, 42). The plane A-A' in FIG. 5B corresponds to the plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the insulating cap layer 70 concurrently with deposition of the at least one dielectric support pillar 7P can be present over the insulating cap layer 70 as a contact level dielectric layer 73. Each of the at least one dielectric support pillar 7P and the contact level dielectric layer 73 is an optional structure. As such, the contact level dielectric layer 73 may, or may not, be present over the insulating cap layer 70 and the retro-stepped dielectric material portion 65. Alternatively, formation of the contact level dielectric layer 73 may be omitted, and at least one via level dielectric layer may be subsequently formed, i.e., after formation of a backside contact via structure.

The contact level dielectric layer 73 and the at least one dielectric support pillar 7P can be formed as a single contiguous structure of integral construction, i.e., without any material interface therebetween. In another embodiment, the portion of the dielectric material that is deposited over the insulating cap layer 70 concurrently with deposition of the at least one dielectric support pillar 7P can be removed, for example, by chemical mechanical planarization or a recess etch. In this case, the contact level dielectric layer 73 is not present, and the top surface of the insulating cap layer 70 can be physically exposed.

In an alternative embodiment, the at least one dielectric support pillars 7P can be formed during the processing steps that are employed to form the memory stack structures 55. For example, support openings (not shown) can be formed in the contact region 300 through the alternating stack (32, 42) and optionally through the retro-stepped dielectric material portion 65 simultaneously with formation of the memory openings 49. Lower portions of the support openings can be filled with additional epitaxial material portions that are formed simultaneously with formation of the epitaxial channel portions 11 in the memory openings 49, and upper portions of the support openings can be filled with support pillar structures that are formed simultaneously with formation of the memory films 50, the semiconductor channels 60, the dielectric cores 62, and the drain regions 63. Each support pillar structure can include an instance of an identical layer stack as a memory film 50 and a semiconductor channel 60, an instance of a dielectric material portion having a same material composition as a dielectric core 62, and a dummy drain region having a same material composition as a drain region 63.

A photoresist layer (not shown) can be applied over the alternating stack (32, 42), and is lithographically patterned to form at least one elongated openings in each area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed.

Figure 6:
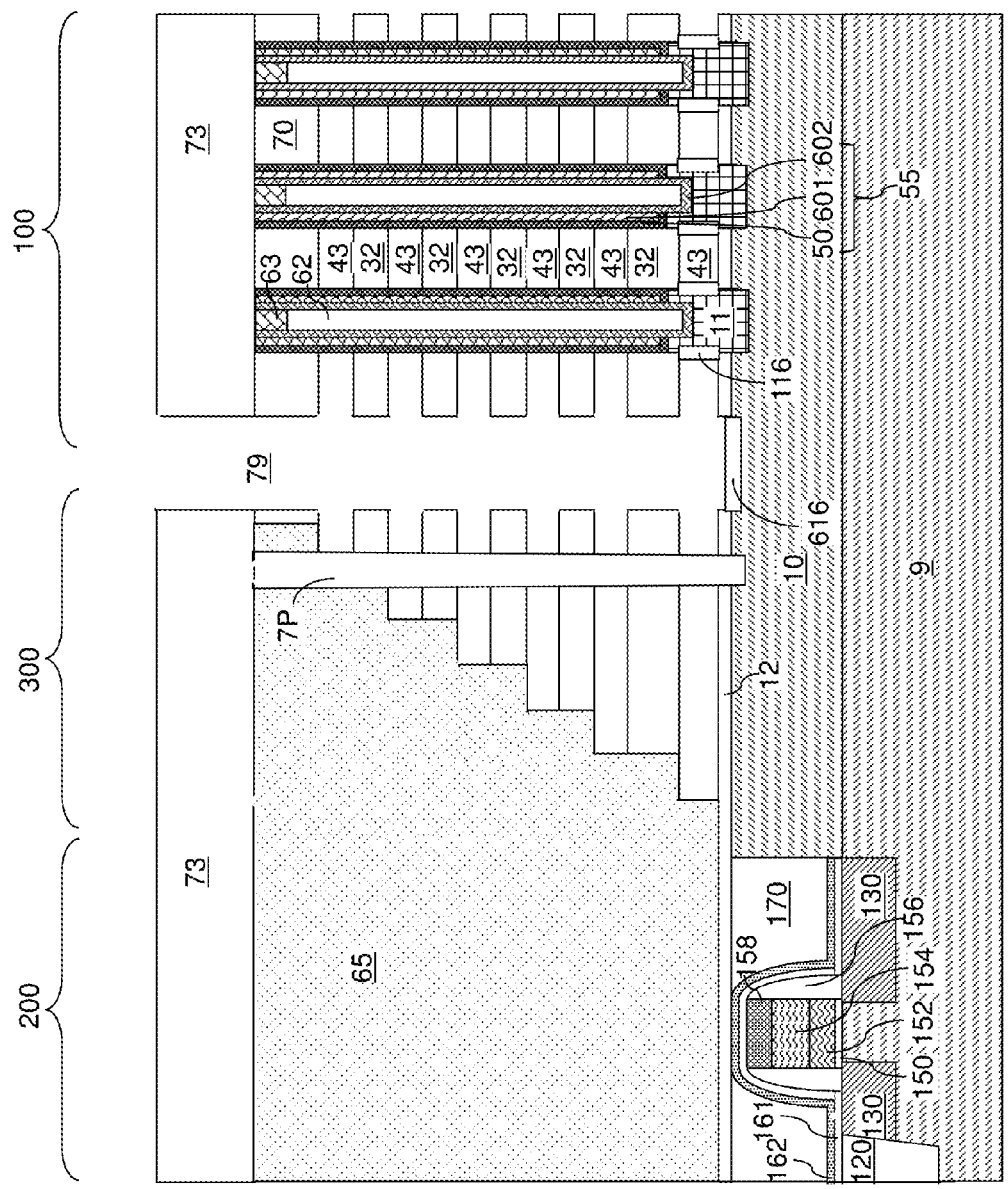
FIG. 6 is a vertical cross-sectional view of the exemplary structure after formation of backside recesses according to an embodiment of the present disclosure.
Figure 7A:
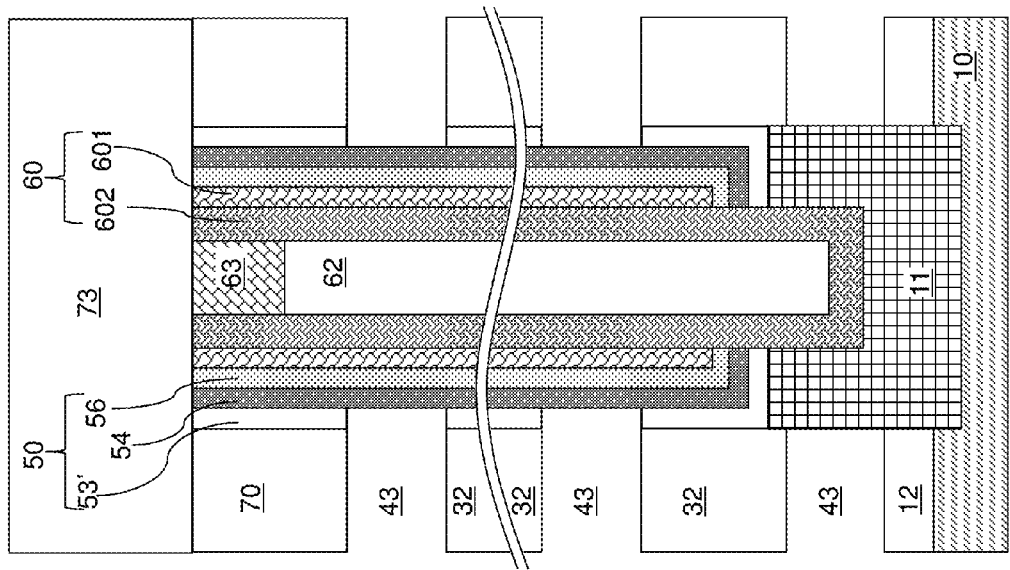

Referring to FIGS. 6 and 7A, an etchant that selectively etches the second material of the sacrificial material layers 42 with respect to the first material of the insulating layers 32 can be introduced into the at least one backside trench 79, for example, employing an etch process. FIG. 7A shows a region around a memory stack structure 55 within the exemplary structure of FIG. 6. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the silicon oxide layer 53 within each memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, the etch stop layer 53, and the retro-stepped dielectric material portion 65 can be selected from silicon oxide, silicon nitride, and dielectric metal oxides. In this case, the depth of the at least one backside trench 79 can be modified so that the bottommost surface of the at least one backside trench 79 is located within the dielectric pad layer 12, i.e., to avoid physical exposure of the top surface of the semiconductor material layer 10.

The etch process that removes the second material of the sacrificial material layers 42 selective to the first material of the insulating layers 32 and the silicon oxide layers 53 of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42. The lateral etch is stopped on the etch stop layer 53.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the memory device region 100 comprises an array of monolithic three-dimensional NAND strings having a plurality memory stack structures 55 and a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Figure 7B:
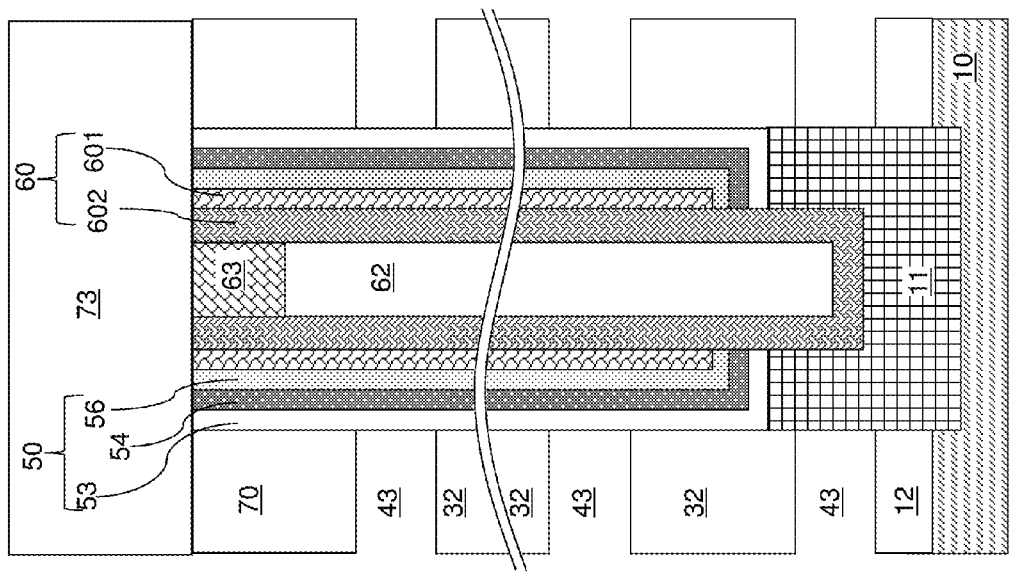

Referring to FIG. 7B, physically exposed portions of the silicon oxide layer 53 can be etched at each level of the backside recesses 43 selective to the oxygen-containing dielectric silicon compound layer 54 after removal of the spacer material layers, i.e., the sacrificial material layers 42. For example, an isotropic etch such as a wet etch employing dilute hydrofluoric acid can be employed to remove portions of the silicon oxide layer 53 located at the levels of the backside recesses 43. In one embodiment, the nitrogen content in the oxygen-containing dielectric silicon compound layer 54 can be at a level that provides sufficient etch selectivity with respect to silicon oxide in the silicon oxide layer 53, and to prevent any substantial etching of the oxygen-containing dielectric silicon compound material of the oxygen-containing dielectric silicon compound layer 54. In one embodiment, the composition of the oxygen-containing dielectric silicon compound layer 54 can be $Si_{(1+/-\delta)}O_{2(1-x)}N_{4x/3}$ in which S is in a range from, and including, 0 to 0.1, and x is in a rage greater than 0.2 and less than 1.0.

Upon removal of the portions of the silicon oxide layer 53 from the levels of the lateral recesses 43, outer sidewalls of the oxygen-containing dielectric silicon compound layer 54 are physically exposed at each level of the backside recesses 43. If the insulating layers 32 include silicon oxide, surface portions of the insulating layers 32 can be collaterally recessed to expand the volume of each backside recess 43 during etching of the portions of the silicon oxide layer 53 at the levels of the backside recesses 43. Each remaining portions of the silicon oxide layer 53 is an annular silicon oxide portion 53'. An annular silicon oxide portion 53' can be located at each level of the insulating layers 32. In one embodiment, annular silicon oxide portions 53' can laterally surround respective oxygen-containing dielectric silicon compound portions 54', and can be laterally surrounded by respective insulating layers 32. In one embodiment, the insulating layers 32 can be deposited by chemical vapor deposition employing TEOS as a precursor and include carbon at a higher concentration than the annular silicon oxide portions 53', which are derived from the silicon oxide layer that can be deposited with lesser carbon content therein employing atomic layer deposition or in another chemical vapor deposition process.

Referring to FIG. 7C, a continuous silicon nitride layer 154 can be formed from surface portions of the insulating layers 32 and portions of the oxygen-containing dielectric silicon compound layers 54 located at the levels of the backside recesses 43. Specifically, physically exposed surface portions of the insulating layers 32 and the portions of the oxygen-containing dielectric silicon compound layer 54 can be simultaneously converted into the continuous silicon nitride layer 154, which is a continuous silicon nitride material portion that extends from a bottommost insulating layer 32 to a topmost insulating layer 32. Conversion of the surface portions of the insulating layers 32 and the portions of the oxygen-containing dielectric silicon compound layer 54 into the silicon nitride portions of the continuous silicon nitride layer 154 can be performed by a nitridation process.

The nitridation can be selected from a process selected from a thermal nitridation process and a plasma nitridation process.

In one embodiment, the horizontal portions 254 of the silicon nitride layer 154 may have a lower nitrogen content than the vertical portions 354 of the silicon nitride layer 154. Thus, the horizontal portions 254 may comprise oxygen doped silicon nitride and the vertical portions 354 may comprise silicon nitride having unavoidable oxygen concentration or oxygen doped silicon nitride having a lower oxygen content than the horizontal portions. In this case, conversion of the vertical portions 354 of the oxygen-containing dielectric silicon compound layer 54 at the levels of the backside recesses 43 into silicon nitride can proceed at a greater rate than conversion of the surface portions of the insulating layers 32 into silicon nitride (e.g., into the horizontal portions 254 and additional vertical portions on the back side of the insulating layers 32 exposed in the trench 79). The thickness of the vertical portions 354 of the continuous silicon nitride layer 154 derived from the oxygen-containing dielectric silicon compound layer 54 can be greater than, or can be substantially the same as, the horizontal portions 254 of the continuous silicon nitride layer 154 derived from surface portions of the insulating layers 32. In one embodiment, the vertical portions 354 of the continuous silicon nitride layer 154 can have a thickness in a range from 1 nm to 10 nm such as from 2 nm to 6 nm. The horizontal portions 254 of the continuous silicon nitride layer 154 overlying or underlying a backside recess 43 can be in a range from 20% to 80% of the thickness of the vertical portions of the continuous silicon nitride layer 154.

The portions of the oxygen-containing dielectric silicon compound layer 54 that are converted into vertical portions 354 of the silicon nitride layer 154 are charge storage elements of a memory device. The remaining portions of the oxygen-containing dielectric silicon compound layer 54 form oxygen-containing dielectric silicon compound portions 54' located at the levels of the insulating layers 32 and vertically spaced from one another. The vertical portions of the silicon nitride layer 154 on the tunneling dielectric 56 at the levels of the backside recesses 43 and the oxygen-containing dielectric silicon compound portions 54' located at the levels of the insulating layers 32 collectively constitute a compositionally modulated charge storage layer 540. The ability to retain electrical charges in the compositionally modulated charge storage layer 540 vertically modulates with nitrogen concentration therein. Thus, the silicon nitride portions (which are vertical portions of the continuous silicon nitride layer 154 that contacts the tunneling dielectric 56) of the compositionally modulated charge storage layer 540 has a greater capacity to trap charge carriers (such as electrons or holes) than the oxygen-containing dielectric silicon compound portions 54' of the compositionally modulated charge storage layer 540.

In one embodiment, an epitaxial channel portion 11 can be provided at the bottom of the memory stack structure 55. The epitaxial channel portion 11 comprises a single crystalline semiconductor material (e.g., single crystal silicon) that is epitaxially aligned to another single crystalline semiconductor material (e.g., single crystal silicon) in the substrate (9, 10). A portion of the continuous silicon nitride layer 154 can contact a sidewall of the epitaxial channel portion 11.

Referring to FIG. 7D, at least one backside blocking dielectric layer (153, 152) can be formed on the continuous silicon nitride layer 154, for example, employing one or more conformal deposition methods. For example, a continuous silicon oxide layer 153 and a continuous dielectric metal oxide layer 152 can be sequentially formed in the backside recesses 43, over the sidewalls of the backside trench 79, and over the contact level dielectric layer 73. The continuous silicon oxide layer 153 can have a thickness in a range from 1 nm to 6 nm, although lesser and greater thicknesses can also be employed. The continuous dielectric metal oxide layer 152 includes a dielectric metal oxides such as aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, or stacks thereof. The continuous dielectric metal oxide layer 152 can have a thickness in a range from 1 nm to 6 nm, although lesser and greater thicknesses can also be employed. The layer stack of the continuous silicon nitride layer 154 and the continuous silicon oxide layer 153 collectively constitutes a backside blocking dielectric layer (152, 153).

Figure 7E:
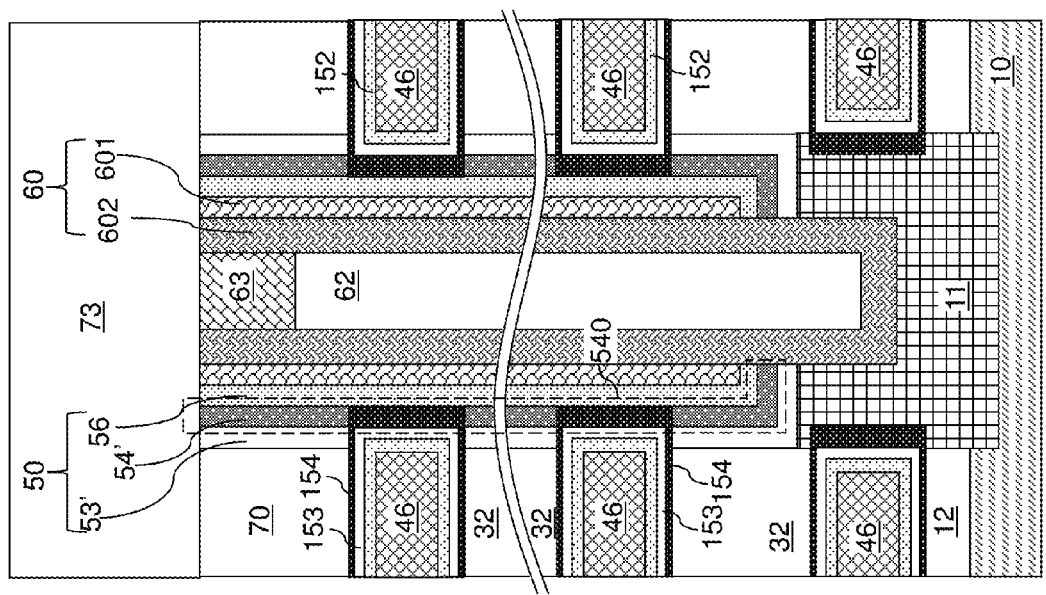
Figure 8:
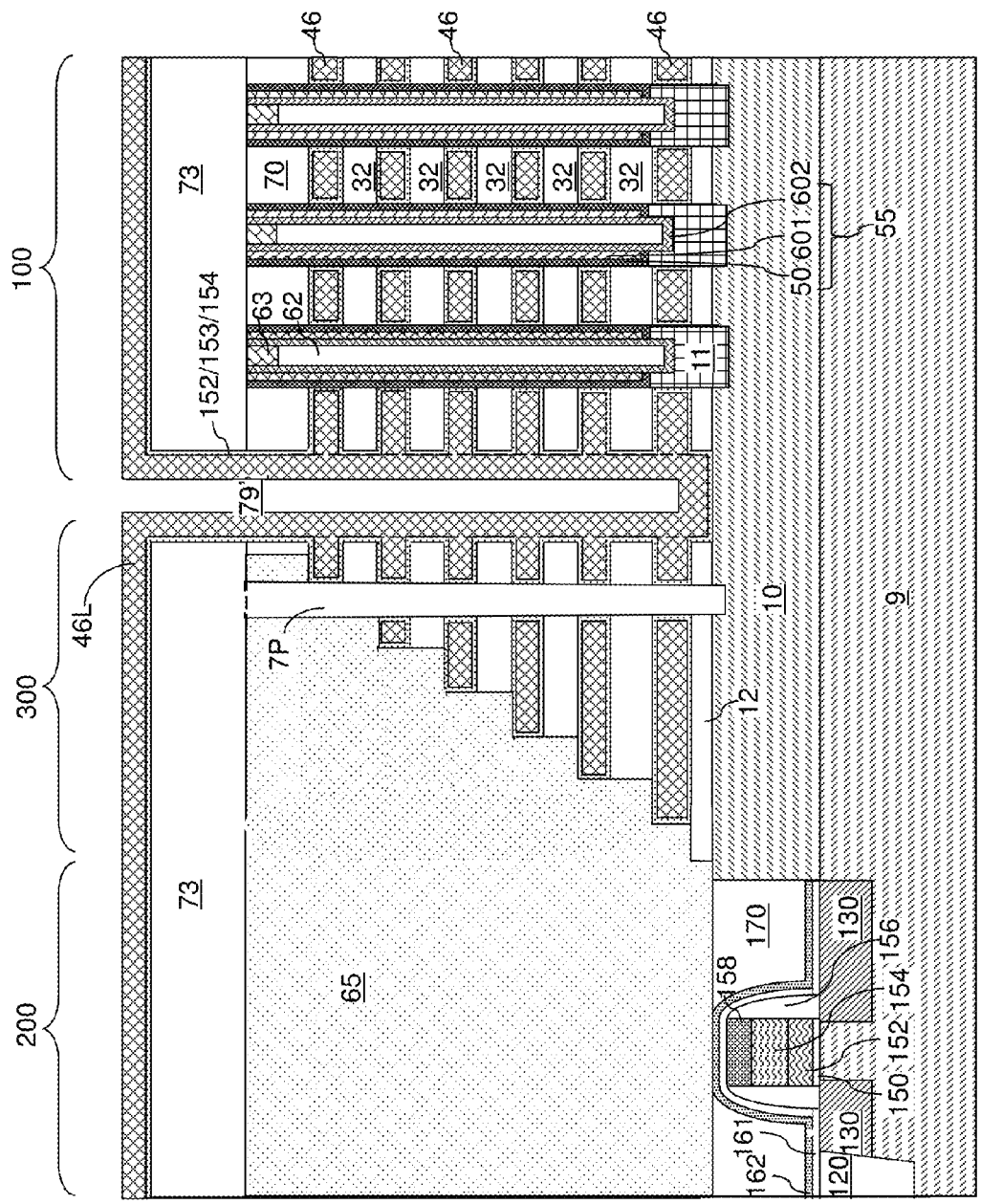
FIG. 8 is a vertical cross-sectional view of the exemplary structure after formation of electrically conductive layers according to an embodiment of the present disclosure.

Referring to FIGS. 7E and 8, at least one metallic material can be deposited in the unfilled volumes of the backside recesses 43, over the sidewalls of the at least one the backside contact trench 79, and over the top surface of the contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material. In one embodiment, the metallic material can be deposited by chemical vapor deposition.

A plurality of electrically conductive layers 46 can be formed in the plurality of backside recesses 43, and a contiguous metallic material layer 46L can be formed on the sidewalls of each backside contact trench 79 and over the contact level dielectric layer 73. Thus, each sacrificial material layer 42 can be replaced with an electrically conductive layer 46. A backside cavity 79' is present in the portion of each backside contact trench 79 that is not filled with the backside blocking dielectric layer (152, 153), the continuous silicon nitride layer 154, and the contiguous metallic material layer 46L.

Figure 9:
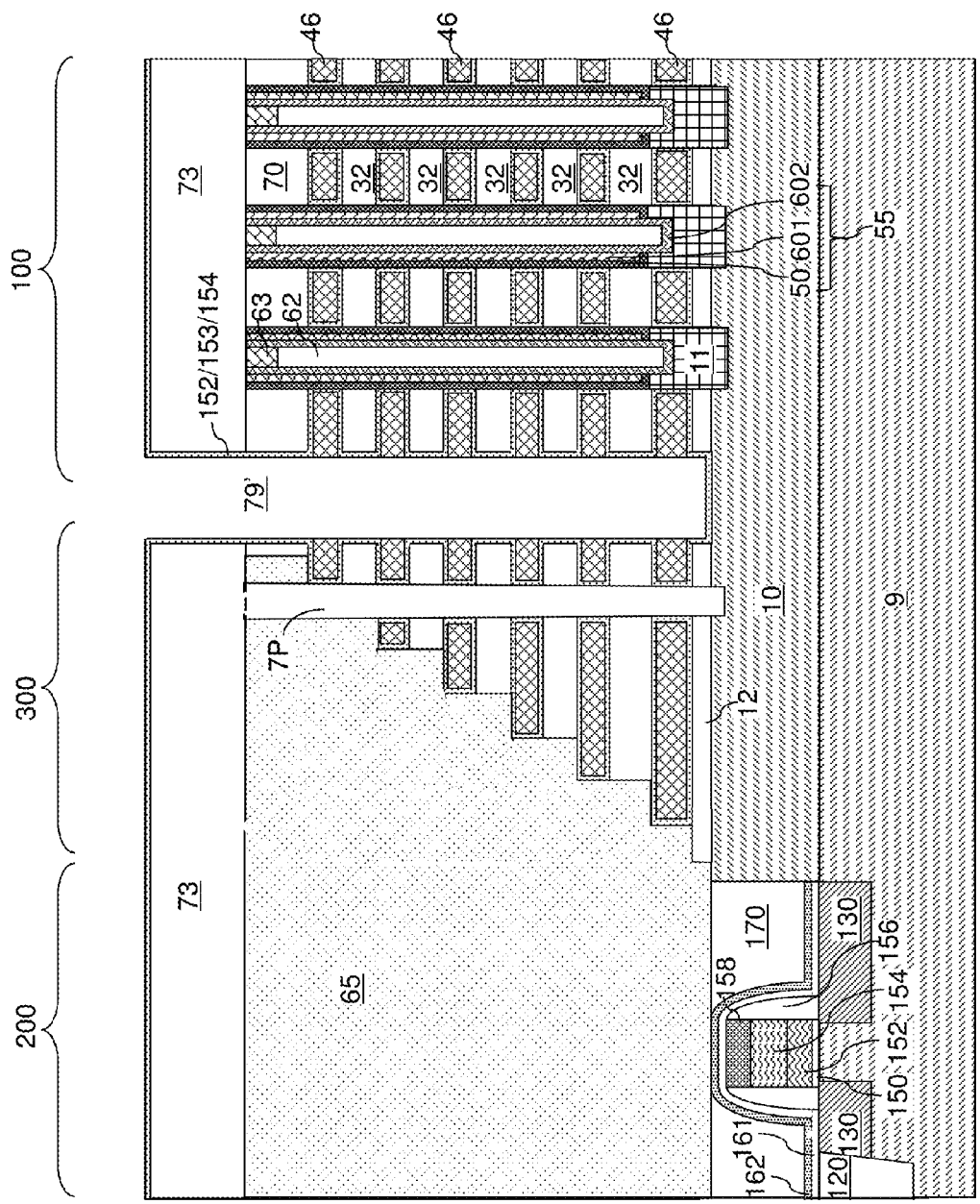
FIG. 9 is a vertical cross-sectional view of the exemplary structure after removal of a deposited conductive material from within the backside trench according to an embodiment of the present disclosure.

Referring to FIG. 9, the deposited metallic materials of the contiguous electrically conductive material layer 46L is etched back from the sidewalls of each backside contact trench 79 and from above the contact level dielectric layer 73, for example, by an anisotropic or isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 10:
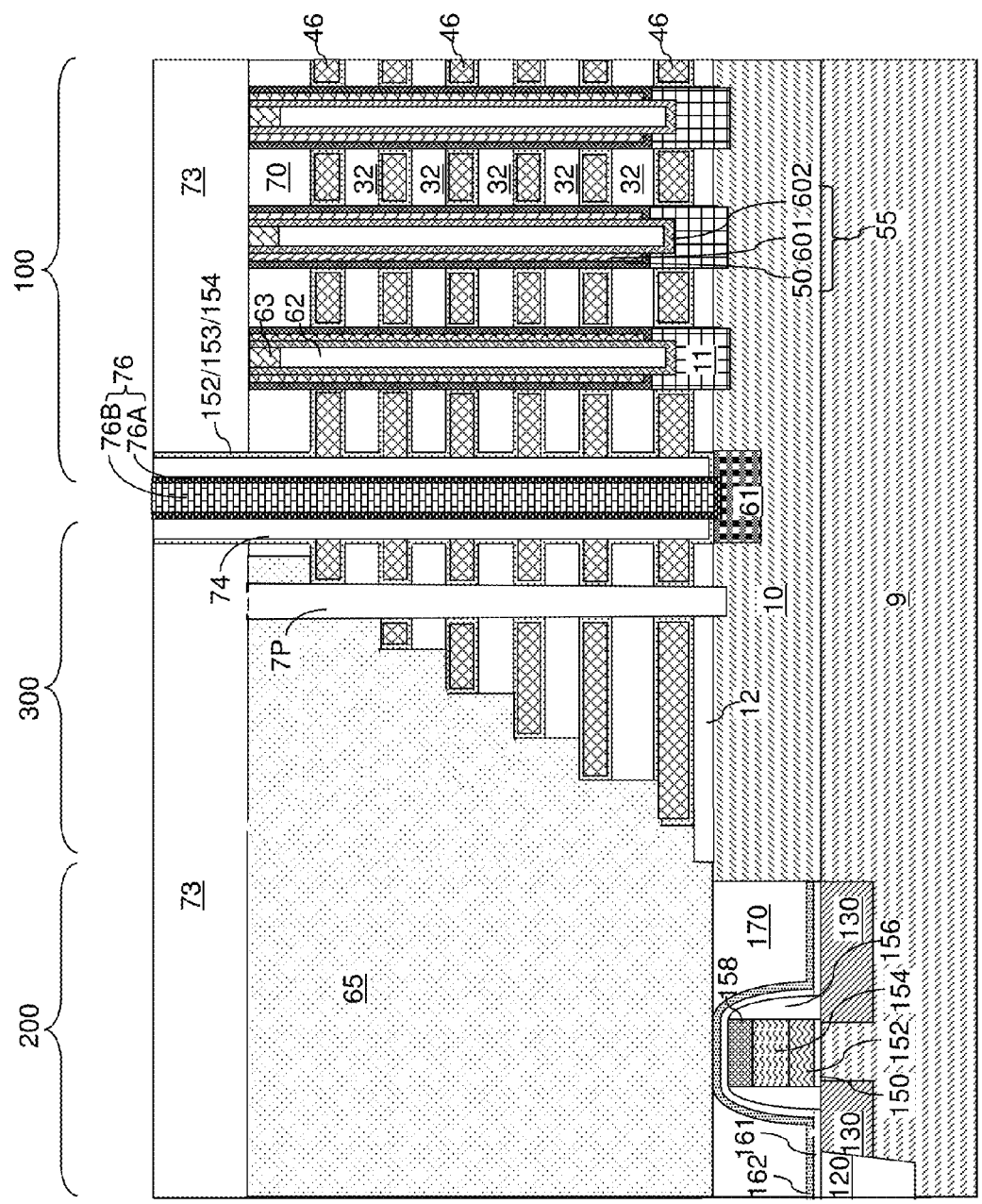
FIG. 10 is a vertical cross-sectional view of the exemplary structure after formation of an insulating spacer, a source region, and a backside contact trench according to an embodiment of the present disclosure.

Referring to FIG. 10, an insulating spacer 74 can be formed by deposition of a conformal insulating material layer and an anisotropic etch that removes horizontal portions of the conformal insulating material layer. A source region 61 can be formed at the bottom of each cavity 79' by implantation of electrical dopants into surface portions of the semiconductor material layer 10 that underlie an opening through the insulating spacer 74. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can contact a bottom surface of the insulating spacer 74.

A contact via structure 76 can be formed within each cavity 79'. Each contact via structure 76 can fill a respective cavity 79'. Each contact via structure 76 can be formed inside an insulating spacer 74 located within a respective backside contact trench 79. The contact via structures 76 can be formed by depositing at least one conductive material in each remaining unfilled volume (i.e., the cavities 79') of the backside contact trenches 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof. Alternatively, the portions 76A and 76B may comprise a metal, such as W, and doped polysilicon.

The at least one conductive material can be planarized, for example, by chemical mechanical planarization (CMP). Each remaining continuous portion of the at least one conductive material in the backside contact trenches 79 constitutes a backside contact via structure 76. Each contact via structure 76 can be formed directly on a top surface of a source region 61.

Figure 11:
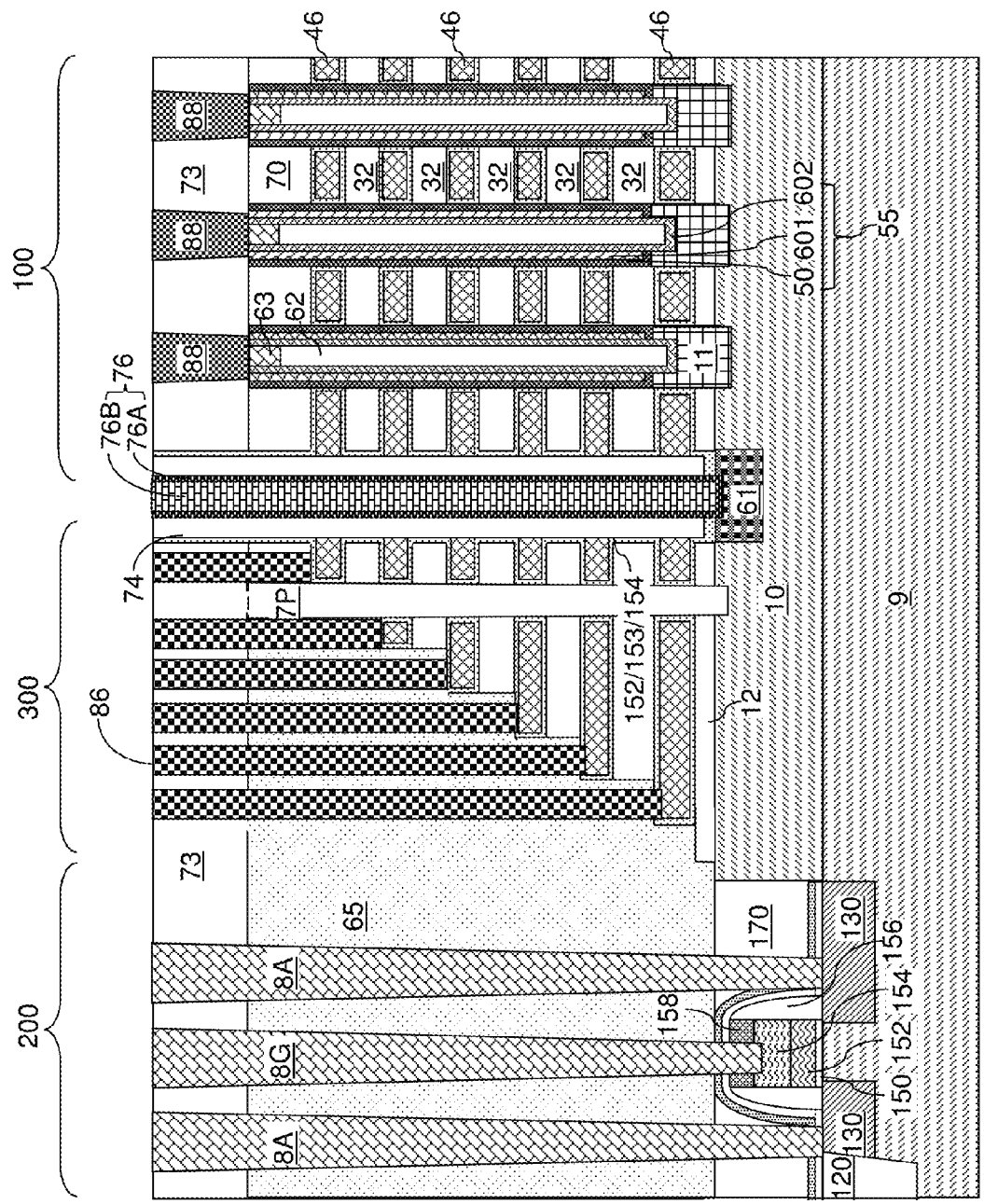
FIG. 11 is a vertical cross-sectional view of the exemplary structure after formation of additional contact via structures according to an embodiment of the present disclosure.

Referring to FIG. 11, additional contact via structures (88, 86, 8A, 8G) can be formed through the contact level dielectric layer 73, and optionally through the retro-stepped dielectric material portion 65. For example, drain contact via structures 88 can be formed through the contact level dielectric layer 73 on each drain region 63. Bit lines (not shown) are subsequently formed in electrical contact with the structures 88. Word line contact via structures 86 can be formed on the electrically conductive layers 46 through the contact level dielectric layer 73 and through the retro-stepped dielectric material portion 65. Peripheral gate contact via structures 8G and peripheral active region contact via structures 8A can be formed through the retro-stepped dielectric material portion 65 directly on respective nodes of the peripheral devices.

The exemplary structure of the present disclosure includes a three-dimensional memory device. The three-dimensional memory device can include an alternating stack of insulating layers 32 and electrically conductive layers 46 located over a substrate (9, 10); and a memory stack structure 55 extending through the alternating stack (32, 42) and comprising a compositionally modulated charge storage layer 540, a tunneling dielectric 56, and a vertical semiconductor channel 60. The compositionally modulated charge storage layer 540 comprises a vertically alternating stack of silicon nitride portions (i.e., vertical portions of the continuous silicon nitride layer 154) and oxygen-containing dielectric silicon compound portions 54'.

In one embodiment, each silicon nitride portion of the compositionally modulated charge storage layer 540 can be a vertical portion of a continuous silicon nitride layer 154 that extends from a bottommost level of the electrically conductive layers 46 to a topmost level of the electrically conductive layers 46. In one embodiment, horizontal portions of the continuous silicon nitride layer can have a lesser thickness than the silicon nitride portions of the compositionally modulated charge storage layer 540.

In one embodiment, at least one backside blocking dielectric layer (152, 153) can be located between the continuous silicon nitride layer 154 and each of the electrically conductive layers 46. In one embodiment, the at least one backside blocking dielectric layer (152, 153) can comprise a stack of a continuous silicon oxide layer 153 and a continuous dielectric metal oxide layer 152.

In one embodiment, the insulating layers 32 can comprise silicon oxide, and each horizontal interface region between horizontal portions of the continuous silicon nitride layer 154 and the insulating layers 32 can have a vertical nitrogen concentration gradient induced by the nitridation process. This is because the diffusion of nitrogen atoms into the insulating layers 32 is stochastic and forms a finite-thickness region having a finite nitrogen concentration gradient.

In one embodiment, the tunneling dielectric 56 can contact substantially vertical inner sidewalls of the compositionally modulated charge storage layer 540, which include inner sidewalls of the oxygen-containing dielectric silicon compound portions 54' and the inner sidewalls of the silicon nitride portions 354 of the continuous silicon nitride layer 154. In one embodiment, the oxygen-containing dielectric silicon compound portions 54' can be discrete structures that are vertically spaced apart among one another by the silicon nitride portions 354 and located at each level of the insulating layers 32.

In one embodiment, the silicon nitride portions 354 can be located at each level of the electrically conductive layers 46, and the oxygen-containing dielectric silicon compound portions 54' can be located at each level of the insulating layers 32. In one embodiment, inner sidewalls of the silicon oxide portions 53' can be vertically coincident with inner sidewalls of the oxygen-containing dielectric silicon compound portions 54'. In one embodiment, at least one bottommost oxygen-containing dielectric silicon compound portion 54' among the oxygen-containing dielectric silicon compound portions 54' can contact an outer sidewall of the vertical semiconductor channel 60 (e.g., the outer surface of the second semiconductor channel 602), and all oxygen-containing dielectric silicon compound portions 54' except the at least one bottommost oxygen-containing dielectric silicon compound portion 54' can be laterally spaced from the vertical semiconductor channel 60 by the tunneling dielectric 56.

In one embodiment, the memory device of the present disclosure can be a monolithic three-dimensional memory device comprising a vertical NAND device located over the substrate (9, 10), and the electrically conductive layers 46 can comprise, or are electrically connected to, a respective word line of the vertical NAND device. The substrate (9, 10) can comprise a silicon substrate. The vertical NAND device can comprise an array of monolithic three-dimensional NAND strings located over the silicon substrate. At least one memory cell in a first device level of the three-dimensional array of NAND strings is located over another memory cell in a second device level of the three-dimensional array of NAND string. The silicon substrate can contain an integrated circuit comprising a driver circuit for the memory device located thereon.

The array of monolithic three-dimensional NAND strings can comprise a plurality of semiconductor channels 60 (e.g., 601, 602). At least one end portion of each of the plurality of semiconductor channels 60 (e.g., 601, 602) extends substantially perpendicular to a top surface of the substrate (9, 10). In one embodiment, the plurality of semiconductor channels can be connected in a parallel connection to a common horizontal semiconductor channel portion that is a portion of the semiconductor material layer 10 between a source region 61 and the epitaxial channel portions 11, the epitaxial channel portions 11, and the vertical semiconductor channels 60 that are portions of the memory stack structures 55. The array of monolithic three-dimensional NAND strings can comprise a plurality of charge storage elements (which can be embodied as sections of an oxygen-containing dielectric silicon compound layer 54 that is present within each memory stack structure 55). Each charge storage element can be located adjacent to a respective one of the plurality of semiconductor channels, i.e., adjacent to a respective vertical semiconductor channel 60 (e.g., 601, 602). The array of monolithic three-dimensional NAND strings can comprise a plurality of control gate electrodes having a strip shape extending substantially parallel to the top surface of the substrate (9, 10). The plurality of control gate electrodes comprise at least a first control gate electrode located in the first device level and a second control gate electrode located in the second device level.

The compositionally modulated charge storage layer 540 includes a vertical stack of charge storage regions that are embodied as the vertical portions 354 of the continuous silicon nitride layer 154 located in the memory opening 49. The vertical portions 354 of the continuous silicon nitride layer 154 store electrical charges upon programming. The vertical stack of charge storage regions laterally surrounds the tunneling dielectric 56. The vertical portions of the continuous silicon nitride layer 154 provide superior electrical charge trapping characteristics relative to the oxygen-containing dielectric silicon compound portions 54'. Since the oxygen-containing dielectric silicon compound portions 54' trap less electrical charges, vertical diffusion of electrical charges stored in the vertical portions 354 of the continuous silicon nitride layer 154 can be reduced due to reduced charge trapping property in the oxygen-containing dielectric silicon compound portions 54'. In other words, the charge trapping characteristics of the charge trapping material layer is enhanced at each level of the electrically conductive layers 46 (i.e., in each memory cell), and is suppressed at each level of the insulating layers 32 (i.e., between memory cells). By suppressing or reducing vertical diffusion of trapped electrical charges, charge retention characteristics of the three-dimensional NAND memory device can be enhanced.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    an alternating stack of insulating layers and electrically conductive layers located over a substrate; and
    a memory stack structure extending through the alternating stack and comprising a compositionally modulated charge storage layer, a tunneling dielectric, and a vertical semiconductor channel, wherein the compositionally modulated charge storage layer comprises a vertically alternating stack of silicon nitride portions and silicon oxynitride portions.

2. The three-dimensional memory device of claim 1, wherein each silicon nitride portion of the compositionally modulated charge storage layer is a vertical portion of a continuous silicon nitride layer that extends from a bottommost level of the electrically conductive layers to a topmost level of the electrically conductive layers.

3. The three-dimensional memory device of claim 2, wherein horizontal portions of the continuous silicon nitride layer have a lesser thickness than the silicon nitride portions of the compositionally modulated charge storage layer.

4. The three-dimensional memory device of claim 2, further comprising at least one backside blocking dielectric layer located between the continuous silicon nitride layer and each of the electrically conductive layers.

5. The three-dimensional memory device of claim 4, wherein the at least one backside blocking dielectric layer comprises a stack of a continuous silicon oxide layer and a continuous dielectric metal oxide layer.

6. The three-dimensional memory device of claim 2, wherein:
    the insulating layers comprise silicon oxide; and
    each horizontal interface region between horizontal portions of the continuous silicon nitride layer and the insulating layers has a vertical nitrogen concentration gradient.

7. The three-dimensional memory device of claim 2, further comprising an epitaxial channel portion comprising a single crystalline semiconductor material that is epitaxially aligned to another single crystalline semiconductor material in the substrate, wherein a portion of the continuous silicon nitride layer contacts a sidewall of the epitaxial channel portion.

8. The three-dimensional memory device of claim 1, wherein the tunneling dielectric contacts substantially vertical inner sidewalls of the silicon oxynitride portions and inner sidewalls of the silicon nitride portions.

9. The three-dimensional memory device of claim 1, wherein the silicon oxynitride portions are discrete structures that are vertically spaced apart among one another by the silicon nitride portions and located at each level of the insulating layers.

10. The three-dimensional memory device of claim 9, further comprising annular silicon oxide portions laterally surrounding respective silicon oxynitride portions and laterally surrounded by respective insulating layers.

11. The three-dimensional memory device of claim 1, wherein:
the silicon nitride portions are located at each level of the electrically conductive layers; and
the silicon oxynitride portions are located at each level of the insulating layers.

12. The three-dimensional memory device of claim 1, wherein inner sidewalls of the silicon oxide portions are vertically coincident with inner sidewalls of the silicon oxynitride portions.

13. The three-dimensional memory device of claim 1, wherein:
at least one bottommost silicon oxynitride portion among the silicon oxynitride portions contact an outer sidewall of the vertical semiconductor channel; and
all silicon oxynitride portions except the at least one bottommost silicon oxynitride portion is laterally spaced from the vertical semiconductor channel by the tunneling dielectric.

14. The three-dimensional memory device of claim 1, wherein:
the monolithic three-dimensional memory structure comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *